United States Patent [19]

Okada et al.

[11] 3,892,983

[45] July 1, 1975

[54] SWITCHING CIRCUIT

[75] Inventors: Takashi Okada; Isa Nakamura, both of Tokyo, Japan

[73] Assignee: Sony Corporation, Tokyo, Japan

[22] Filed: Sept. 21, 1973

[21] Appl. No.: 399,305

[30] Foreign Application Priority Data

Sept. 22, 1972 Japan .............................. 47-110349

[52] U.S. Cl. ...................... 307/254; 330/18; 330/51

[51] Int. Cl. .......................... H03k 17/60; H03f 1/00

[58] Field of Search ...... 307/251, 253, 254; 330/51, 330/18

[56] References Cited

UNITED STATES PATENTS

| | | | |
|---|---|---|---|
| 3,505,539 | 4/1970 | Pleshko | 307/254 |
| 3,512,008 | 5/1970 | Dann | 307/254 |
| 3,551,703 | 12/1970 | Bischoff | 307/254 |
| 3,656,002 | 4/1972 | Gilson et al. | 307/254 X |

*Primary Examiner*—John Zazworsky
*Attorney, Agent, or Firm*—Lewis H. Eslinger; Alvin Sinderbrand

[57] ABSTRACT

A switching circuit in which the signal path between a signal input and a signal output terminal includes at least two amplifier stages, the first one of which has its collector connected in a series circuit with a load impedance and the emitter-collector circuit of a switching transistor. The switching transistor is switched between a conductive and a non-conductive state by a switching voltage applied to its base. The base of a second amplifier stage is connected between the collector of the first stage and the load so that when the switching transistor is made non-conductive by preventing current from flowing in its emitter-collector circuit but also makes the second stage non-conductive by reducing its base current to zero. Making the first stage non-conductive keeps it from amplifying the signal and requires any leakage current to pass around the first stage by means of stray capacitance. Making the first and second stages non-conductive simultaneously prevents even the leakage current from being amplified and allows the leakage current to reach the output terminal only by way of a second stray capacitance, which further reduces the amplitude of such current. A cascode stage may be included between the first and second stages to be rendered non-conductive along with them as a further means of amplifying the signal when the transistors are operative and decoupling the signal when the transistors are non-conductive. Instead of a simple cascode stage, a differential amplifier stage may be included between the first and second stages to provide means for adjusting the gain of the circuit.

6 Claims, 7 Drawing Figures

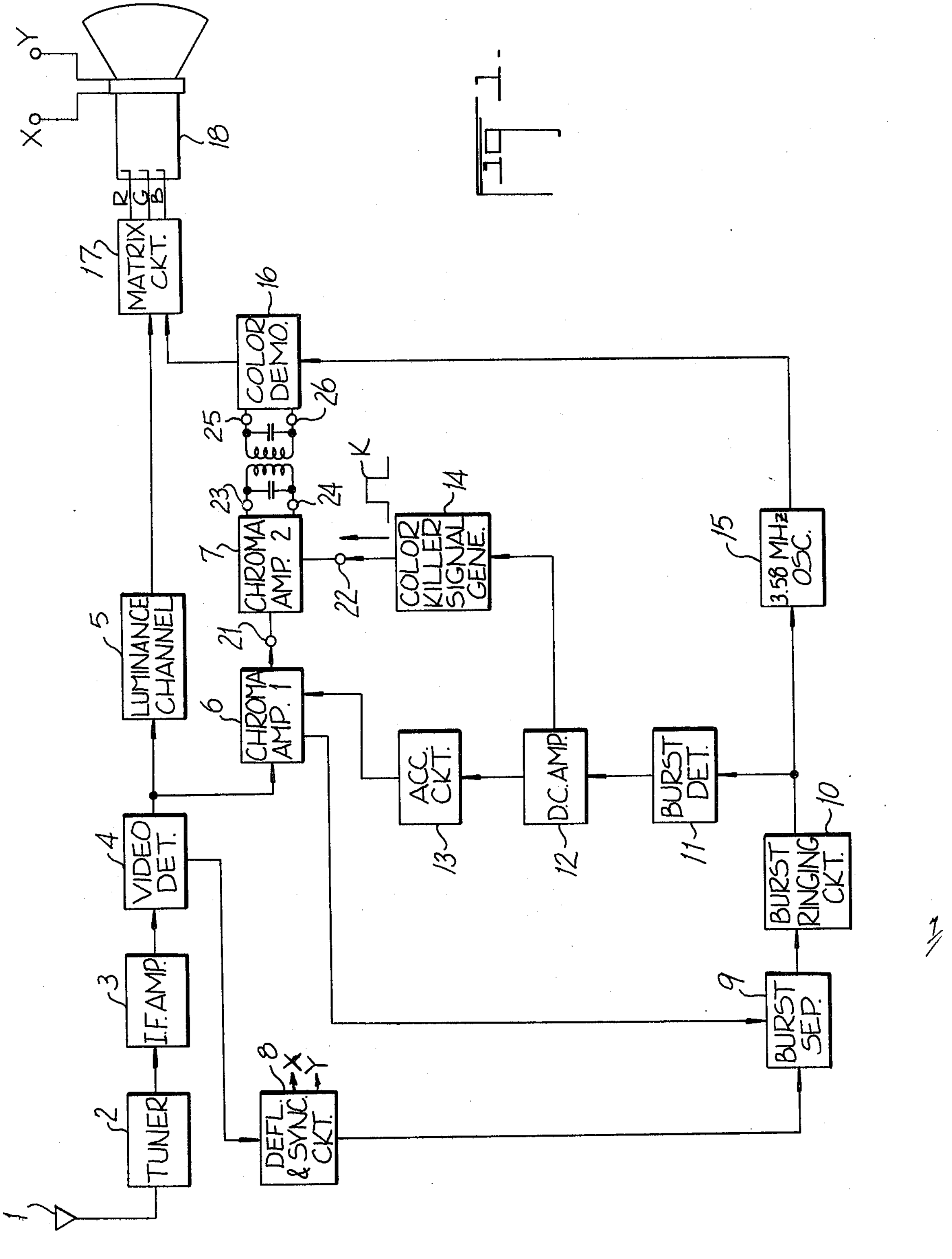
TUNER
I.F. AMP.
VIDEO DET.
LUMINANCE CHANNEL
CHROMA AMP. 1
CHROMA AMP. 2
COLOR DEMO.
MATRIX CKT.
DEFL. & SYNC. CKT.
BURST SEP.
BURST RINGING CKT.
BURST DET.
D.C. AMP.
ACC. CKT.
COLOR KILLER SIGNAL GENE.
3.58 MHz OSC.
R G B
X Y
K

PRIOR ART

SWITCHING CIRCUIT

BACKGROUND OF THE INVENTION

1. Field of the Invention

This invention relates to the field of transistor switching circuits having minimum power consumption and minimum signal leakage when the signal path therethrough is intended to be open. In particular, the invention relates to an improved color television receiver chrominance circuit controlled by a color killer signal to allow chrominance frequency signals to pass through only in the absence of a color killer signal.

2. Prior Art

Transistor switching circuits for controlling the flow of signal current have been made heretofore in several forms. In one form a differential amplifier is connected so that one of its transistors is an amplifier in the path of the signal and the other of its transistors is connected to the switching signal. The first transistor amplifies the input signal when the second transistor is non-conductive but is turned off when the second transistor is conductive. Another amplifier stage is connected to the first transistor to receive the signal therefrom when the second transistor is non-conductive. However, when the second transistor is conductive, it is still possible for some of the input signal to leak around the first transistor by way of stray capacitance. Since the second stage is still conductive, it can amplify this leakage signal current and adversely affect the operation of further circuits. Furthermore, the second stage is always conductive and at least one of the differentially connected transistors is always conductive so that there is substantial power consumption at all times. This is undesirable in integrated circuits and therefore this type of switching circuit is not suitable for such circuits.

Another form of prior art circuit incorporates a switching transistor across the base-emitter input terminals of a first amplifying stage. When the switching transistor is non-conductive, the input stage can amplify normally. When the switching transistor is conductive, it not only makes the input stage non-conductive, but it forms a low impedance path to ground for the signal current that would otherwise leak through stray capacitance and by-pass the input stage. A second amplifying stage connected to the output of the first amplifying stage remains conductive even when the first amplifying stage becomes non-conductive and, therefore, the power consumption is too great. However, this circuit does have the advantage over the first-mentioned circuit of reducing the leakage signal current.

Still another form of prior art circuit includes a switching transistor having its emitter-collector circuit connected in the emitter circuit of the final signal amplifying transistor. When this switching transistor is made nonconductive, the signal amplifying transistor that would normally carry the most current is also nonconductive. Thus, in the condition when it is not supposed to amplify the applied signal, this circuit has relatively low power dissipation, but there may still be an undesirable leakage signal around the non-conductive signal amplifying transistor.

SUMMARY OF THE INVENTION

In accordance with the present invention the signal that is to be switched is applied to a first semiconductor amplifier device, which may be a transistor. The output circuit of the first semiconductor amplifier device is connected to a second semiconductor amplifier device that further amplifies the output signal of the first amplifier device. Both of the semiconductor amplifier devices may be transistors.

A switching semiconductor device, which may also be a transistor, is connected in series with the output circuit of the first amplifier device and is controlled by a switching signal that can have two levels, one designated as the OPEN level and the other as the CLOSED level. The designation for these two levels arises from the fact that, when the switching signal is at the CLOSED level, the information signal passes through the amplifier devices as it would through a closed switch. On the other hand, when the switching voltage is at the OPEN level, the information signal is unable to pass through the amplifier devices but is interdicted as it would be by an open switch. When the switching voltage applied to the switching device reaches the OPEN level after having been at the CLOSED level, the output circuit of the switching device becomes non-conductive. This has the effect of disconnecting the output circuit of the first amplifier device from its source of operating voltage and, therefore, making it nonconductive. While such an effect could be obtained, in the case of a transistor amplifying device, by connecting the output circuit of the switching device on either the emitter or the collector side of the emitter-collector output circuit, this invention requires that the switching device be on the collector side. In more general terms, when the semiconductor amplifier device has an output circuit, one end of which is common with or connected to the input circuit of that transistor, the output circuit of the switching device must be connected to the other end of the output circuit of the amplifier device.

A load impedance for the first semiconductor amplifier device is connected in series with the output circuit of the amplifier device at the same end thereof as the output circuit of the switching device. In this series circuit, the load impedance may be connected between the output circuits of the amplifier device and the switching device, or the output circuit of the switching device may be connected between the load impedance and the amplifier device.

An input electrode of a second semiconductor amplifier device is connected to a point in the series circuit between the output circuit of the first amplifier device and the load impedance. As a result, when the first amplifier device and the switching device become non-conductive in response to a switching voltage at the OPEN level, the second amplifier device also becomes non-conductive. This reduces the dissipation of the circuit when it is in an OPEN condition and it also reduces transmission of leakage signal current substantially, since any leakage current would have to find a path by way of stray capacitances around two non-conductive amplifier devices instead of only one.

In another embodiment, the circuit may be further improved by adding another semiconductor amplifier device in cascode between the first semiconductor amplifier device and the connection to the input electrode of the second semiconductor amplifier device. By connecting a control electrode of the third semiconductor amplifier device to a source of the switching voltage so that the third amplifier device will be controlled by the switching signal, the third amplifier device may be made non-conductive along with the first and second amplifier devices. This circuit produces greater gain when all of the amplifier devices are conductive and the circuit is in the CLOSED condition, and it further reduces the leakage current when the circuit is in the OPEN condition, in which all of the amplifier devices would be non-conductive.

In still another embodiment of the invention two more semiconductor devices, differentially connected relative to each other, are connected to the same end of the output circuit of the first amplifier device as the load impedance. One of these two additional semiconductor devices has an input electrode connected to a variable bias source as a volume control and has its output circuit connected in series between the output circuit of the first amplifier device and the load impedance. The other, differentially connected, semiconductor device has its output circuit connected in series between the output circuit of the first amplifier device and the power supply terminal through which operating current is supplied to the circuit. The second semiconductor amplifier device has its input electrode connected to a point on the series circuit between the output circuit of the first additional semiconductor device and the load impedance. Placing the switching voltage at the OPEN level causes this series circuit to be non-conducitve by making the switching device, and therefore, the first additional amplifier device and the second amplifier device non-conductive. The other, differentially connected, semiconductor device becomes conductive and virtually short-circuits the output circuit of the first semiconductor device to the power supply terminal.

BRIEF DESCRIPTION OF THE DRAWINGS

FIG. 1 is a block diagram of a television receiver, illustrating the circuit environment in which this invention is used.

FIGS. 5–7 are schematic diagrams of various embodiments of the present invention.

DETAILED DESCRIPTION OF THE INVENTION

Figure 3:
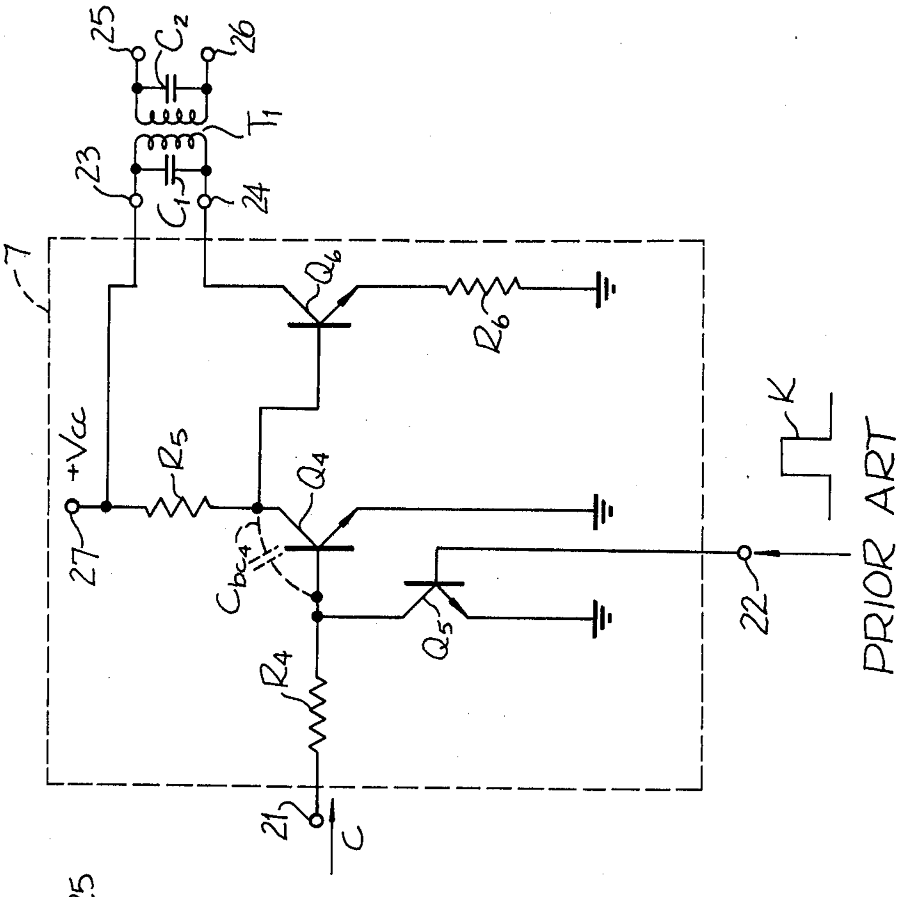
FIGS. 2–4 are schematic diagrams of various embodiments of prior art circuits.

The television circuit illustrated in FIG. 1 includes an antenna 1 for receiving television signals and a tuner 2 for selecting the channel to be viewed. The output of the tuner 2 is connected to an i.f. amplifier 3, which supplies signals to a video detector 4. One output of the video detector is connected to video amplifier in a luminance channel 5 and to successive chrominance amplifiers 6 and 7. Another output of the video detector circuit 4 is connected to a deflection and synchronizing signal circuit 8 that supplies signals to the terminals X and Y of a deflection yoke. The deflection and synchronizing circuit 8 also supplies gating signals to a burst separator circuit 9. The separator circuit receives chrominance and burst signals from the first chrominance amplifier 6. The gated burst signal from the separator circuit 9 is applied to a burst ringing circuit 10, which transforms the intermittent bursts into a more continuous signal of the same frequency. The output of the burst ringing circuit 10 is connected to a burst detector 11 which, in turn, supplies signals to a DC amplifier 12. The output of the DC amplifier 12 is connected to an automatic chrominance control circuit 13 which is connected to the chrominance amplifier 6 to control the gain of the chrominance amplifier.

The output of the DC amplifier 12 is also connected to a color killer signal generator 14, the purpose of which is to generate a signal K that has two levels. The base level of the signal K represents the output voltage when the tuner 2 is tuned to a color signal of sufficient strength to provide adequate color reproduction. The upper level of the signal K represents the voltage level at this point in the circuit when the tuner 2 is tuned to a signal that is either a black-and-white signal or is such a weak color signal that it would not be possible to reproduce it adequately in color. Thus, the signal K is not a pulse in the usual sense but a representation of two voltage levels. The output of the color killer circuit may, and usually will, remain in either level as long as the receiver is tuned to a specific station and that station transmits one type of signals, either color or black-and-white.

The burst ringing circuit 10 also supplies signals to a local oscillator 15 that supplies the carrier to demodulate the chrominance signals. The output signal of the oscillator 15 is connected to a color demodulator 16 that demodulates chrominance signals and supplies the demodulated signals to a matrix circuit 17 where they are combined with luminance signals from the luminance channel 5 to produce the required red, green and blue signals to modulate the intensity of electron beams in a television picture tube 18.

The present invention deals with circuits in the second chrominance amplifier 7. The terminals 21 and 22 are input terminals to this amplifier to receive, respectively, the chrominance signal from the amplifier 6 and the color killer signal from the color killer signal generator 14. The output of the second chrominance amplifier 7 is connected by way of a pair of terminals 23 and 24 to a coupled tuned circuit having output terminals 25 and 26 connected to the color demodulator 16.

Figure 2:
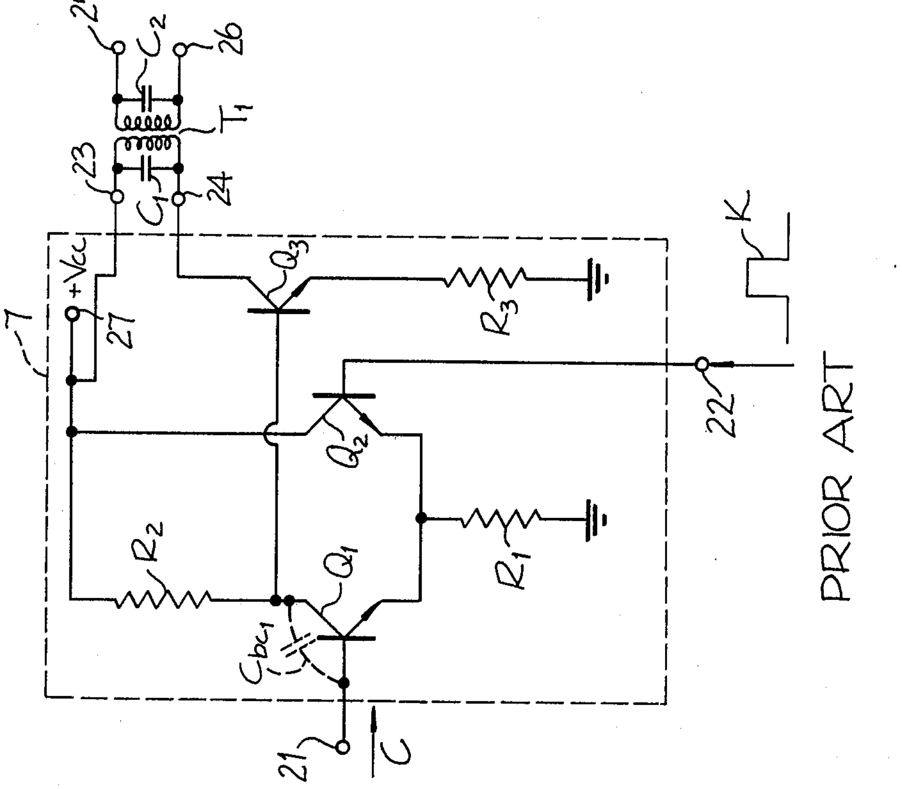

One form of prior art circuit used for the second chrominance amplifier 7 is shown in FIG. 2. In this circuit the chrominance signal C is applied to the input terminal 21 and the color killer signal K is applied to the switching signal input terminal 22. The signal C is not limited to just a chrominance signal but may be considered more generally as an information signal as distingusihed from the signal K. The latter may be referred to as a switching signal.

The input terminal 21 is connected to the base of a first semiconductor amplifier device $Q_1$. In this circuit the semiconductor device $Q_1$ is an NPN transistor and it is connected in a differential amplifier circuit with a second semiconductor amplifier device in the form of a transistor $Q_2$. The base of the transistor $Q_2$ is connected to the switching signal input terminal 22. The emitters of the two transistors $Q_1$ and and $Q_2$ are connected to ground through a common emitter resistor $R_1$. The collector of the transistor $Q_2$ is connected directly to a positive power supply terminal 27 and the collector of the transistor $Q_1$ is connected by way of a load resistor $R_2$ to the same power supply terminal 27. The collector of the transistor $Q_1$ is also connected to the base of a third semiconductor amplifier device in the form of a transistor $Q_3$. The emitter of the transistor $Q_3$ is connected to ground by way of a biasing resistor $R_3$ and the collector of the transistor $Q_3$ is connected to one of the terminals of the coupling circuit, specifically to the primary of a transformer $T_1$. The primary and secondary windings of the transformer are tuned by capacitors $C_1$ and $C_2$. The other terminal 23 of the primary is connected directly to the power supply terminal 27.

As long as a color signal of sufficient strength is being received, the switching signal applied to the terminal 22 will have a value below the cut-off level of the transistor $Q_2$. As a result, the transistor $Q_1$ is conductive and amplifies the information signal and applies it to the second amplifier stage transistor $Q_3$.

However, when the received signal is a black-and-white signal and therefore has no burst signals, the switching signal K applied to the terminal 22 has a more positive value sufficient to make the transistor $Q_2$ sufficiently conductive to cause the transistor $Q_1$ to become non-conductive. In that case, the information signal applied to the input terminal 21 is interdicted and theoretically does not pass through the transistor $Q_1$ to be amplified by the transistor $Q_3$. This condition may be referred to as an OPEN condition, and the voltage level of the switching signal K that causes the circuit to reach the OPEN condition may be considered as an OPEN level. In this instance, a switching level below the OPEN level may be referred to as the CLOSED level for NPN transistors. As shown in FIG. 2, the OPEN level would be more positive than the CLOSED level, but for PNP transistors, the reverse would be true. Furthermore, it is desirable that the circuits that supply the switching signal K to the switching signal input terminal 22 be capable of generating a switching signal of such amplitude that there is a clear difference between the OPEN level and the CLOSED level.

When the transistor $Q_2$ is conductive and the transistor $Q_1$ is not conductive, it is unfortunately still possible for information signals applied to the terminal 21 to find a path around the transistor $Q_1$ to the base of the transistor $Q_3$. Such a path is indicated by stray capacitance $C_{bc_1}$, which is shown connecting the base input electrode of the transistor $Q_1$ to the collector output electrode of that transistor. Since the transistor $Q_3$ is also an NPN transistor, its base bias will be even higher when the transistor $Q_1$ is non-conductive then when it is conductive. Thus, the transistor $Q_3$ is capable of amplifying leakage signals that pass through the stray capacitance from the input terminal 21 to the base of the transistor $Q_3$ even when the circuit 7 is supposedly in an OPEN condition. Furthermore, the transistor $Q_3$ dissipates power in the OPEN condition and this power contributes to heating the circuit elements. Thus, this circuit is not suitable for construction as part of an integrated circuit.

FIG. 3 shows another prior art circuit in which the information signal input terminal 21 is connected by way of a resistor $R_4$ to the base of a first amplifying transistor $Q_4$. This transistor has a load impedance in the form of a resistor $R_5$ and is connected to a second amplifier stage comprising a transistor $Q_6$. The latter has a biasing resistor $R_6$ in its emitter circuit. Switching the circuit 7 in FIG. 3 between the OPEN and CLOSED conditions is accomplished by means of a switching transistor $Q_5$ connected directly in parallel with the baseemitter input terminals of the transistor $Q_4$. The base of the switching transistor $Q_5$ is connected to the switching signal input terminal 22.

When a color television signal of sufficient strength is being received, the voltage level at the switching signal input terminal 22 is below the cutoff level of the transistor $Q_5$. Therefore, the transistor $Q_5$ is not conductive and the signal applied to the information signal input terminal 21 is amplified by the two amplifier stages and is applied to the tuned output circuit.

When a black-and-white televeision signal or a color television of insufficient strength is being received, the switching signal K is applied to the input terminal 22 and has a sufficiently high value to cause the switching transistor $Q_5$ to become conductive. This causes the voltage at the base of the amplifier transistor $Q_4$ to drop below the conductive level, which substantially reduces the amplitude of the signal applied to the base of the second amplifier transistor $Q_6$. As in the circuit in FIG. 2, it would be possible for some of the signal applied to the input terminal 21 to find a leakage path in the form of stray capacitance $C_{bc_4}$ from the base of the transistor $Q_4$ to the collector of that transistor. However, the resistor $R_4$ and the emitter-collector circuit of the conductive switching transistor $Q_5$ form a voltage divider that further reduces the amplitude of the information signal at the base of the transistor $Q_4$. As a result, there is very little signal to leak through the stray capacitance to the transistor $Q_6$. However, the latter is conductive, even in the supposedly OPEN state of the circuit 7, and thus, this circuit is not suitable for construction in an integrated circuit.

Figure 4:
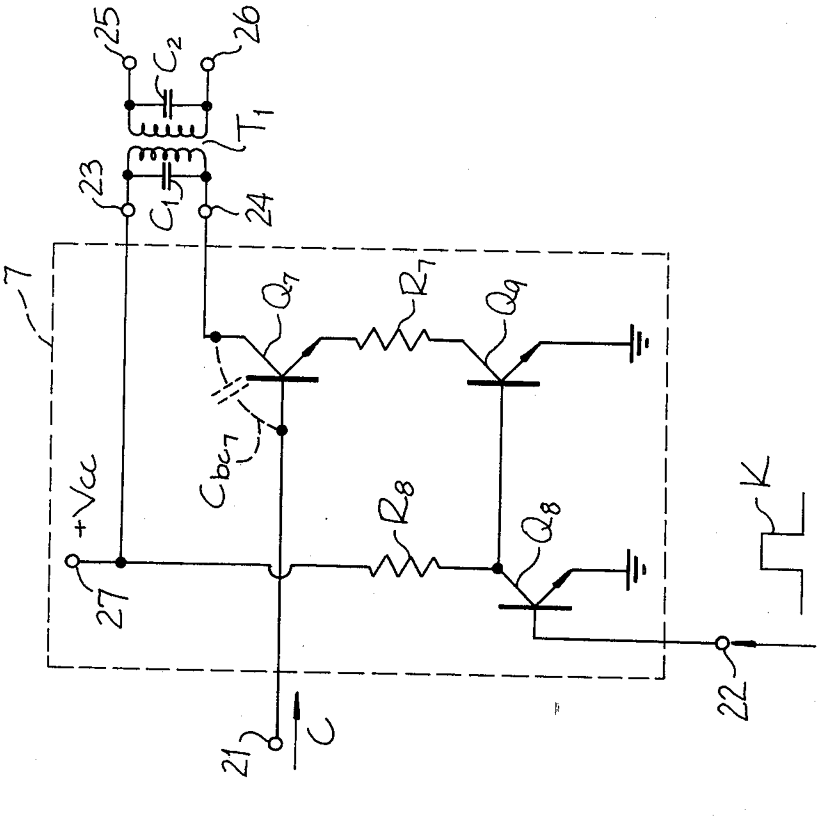

FIG. 4 shows another prior art circuit that has a different switching arrangement. The information signal input terminal 21 is connected to the base of an amplifier transistor $Q_7$, which has a resistor $R_7$ connected to its emitter. The base of a transistor $Q_8$ is connected to the switching signal input terminal 22, and a load resistor $R_8$ is connected from the collector of the transistor $Q_8$ to the power supply terminal 27. The collector of the transistor $Q_8$ is also connected to the base of a transistor $Q_9$ that forms the second stage of the switching circuit. The emitter-collector circuit of the transistor $Q_9$ is connected in series between the resistor $R_7$ and ground. The tuned output transformer $T_1$ is connected to output terminals 23 and 24 of the circuit.

During operation of the circuit in FIG. 4, when the voltage level applied to the switching signal input terminal 22 is at the CLOSED level, the transistor $Q_8$ is non-conductive and the transistor $Q_9$ is conductive. This permits the amplifier transistor $Q_7$ also to be conductive and to amplify the information signal C applied to the input terminal 21.

When the voltage level applied to the switching signal input terminal 22 increases to the OPEN level, the transistor $Q_8$ becomes conductive and causes the transistor $Q_9$ to become non-conductive. This pervents the transistor $Q_7$ from receiving operating current and therefore makes the transistor $Q_7$ also non-conductive.

This mode of operation has the advantage that the transistor $Q_7$ that supplies the amplified information signal at high level to the transformer $T_1$ is non-conductive during the OPEN condition and thus the circuit draws relatively little current during that time. However, the transistor $Q_7$ is the only component between the input terminal 21 and the transformer $T_1$, and it is therefore possible for an undesirably high leakage current to go around the transistor $Q_7$ by way of stray capacitance $C_{bc_7}$. A further undesirable feature of this circuit is that any voltage variation, such as 60 cycle hum, in the power supply connected to the terminal 27 will be amplified by the switching transistor $Q_9$ during the time that the circuit is in its CLOSED condition. This provides an undesirable variation in the output signal at the terminals 25 and 26.

Figure 5:
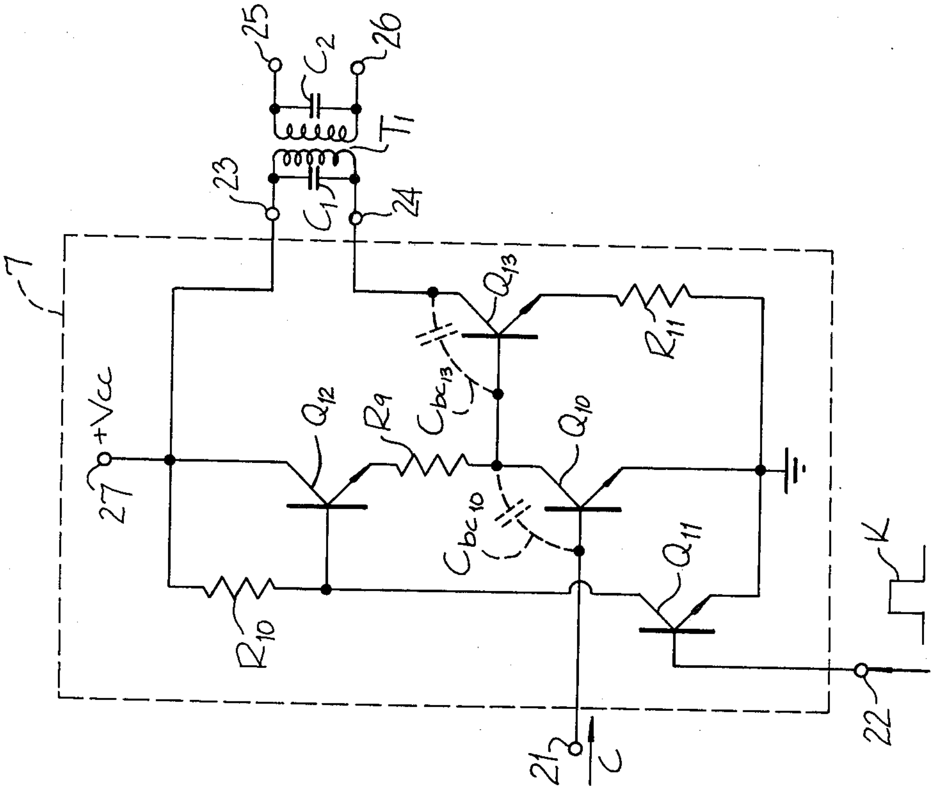

FIG. 5 shows a basic form of the circuit of the present invention. The information input terminal 21 is connected to the input circuit of a semiconductor amplifier device $Q_{10}$. In this embodiment, the semiconductor amplifier device is an NPN transistor. The load resistor $R_9$ is connected in series with the emitter collector output circuit of the transistor $Q_{10}$. The transistor $Q_{10}$ is connected as a grounded emitter amplifier. This means that the emitter, which is common to both the baseemitter input circuit of the transistor and the emitter-collector output circuit of the transistor, is connected to ground and the load resistor is connected to the collector. A switching signal semiconductor device in the form of an NPN transistor $Q_{11}$ has its base input electrode connected to the switching signal input terminal 22. The emitter-collector output circuit of the transistor $Q_{11}$ is connected between ground and a load resistor $R_{10}$, the other end of which is connected to the power supply terminal 27. The collector of the transistor $Q_{11}$ is also connected to the base of the main semiconductor switching device, here shown as an NPN transistor $Q_{12}$. The emitter-collector output circuit of the transistor $Q_{12}$ is connected in series between the power supply terminal 27 and the load resistor $R_9$.

The base input electrode of a second semiconductor amplifier device in the form of another NPN transistor $Q_{13}$ is connected to a point in the series circuit that includes the load resistor $R_9$ and the emitter collector output circuit of the transistor $Q_{10}$, and in fact, the base of the transistor $Q_{13}$ is connected directly to the collector of the transistor $Q_{10}$. A resistor $R_{11}$ is connected between the emitter of the transistor $Q_{13}$ and the ground terminal of the power supply. The collector of the second amplifier transistor $Q_{13}$ is connected by way of the output terminal 24 to the tuned transformer $T_1$.

In the operation of the circuit in FIG. 5, when the voltage applied to the switching signal input terminal 22 is at the CLOSED level, the switching transistor $Q_{11}$ is nonconductive and the second switching transistor $Q_{12}$ is therefore conductive. This permits operating current to flow through the load resistor $R_9$ and the emitter collector output circuit of the transistor $Q_{10}$. An information signal C applied to the information signal input terminal 21 is amplified in succession by the transistors $Q_{10}$ and $Q_{13}$ and is applied to the transformer $T_1$.

Although the impedance of the emitter-collector output circuit of the switching transistor $Q_{12}$ may still be affected by variations in the operating voltage applied to the terminal 27, an advantage of connecting the transistor $Q_{12}$ on the collector side of the amplifier transistor $Q_{10}$ is that the load resistor $R_9$ may be made sufficiently large so that such fluctuations will have no effect on the amplification of the information signal. When the switching voltage K applied to the switching signal input terminal 22 changes from the CLOSED level to the OPEN level, the transistor $Q_{11}$ becomes conductive and reduces the voltage at the base of the switching transistor $Q_{12}$ to the point where the latter, also, can no longer conduct. As a result, the transistor $Q_{10}$ is effectively separated from the power supply terminal 27 and becomes non-conductive. At the same time, the transistor $Q_{13}$ is also made non-conductive by the shift in the bias level of its base. Since both of the amplifier transistors $Q_{10}$ and $Q_{13}$ are non-conductive, any leakage signal current that reached the output terminal 24 from the input terminal 21 would have to pass through two stray capacitances $C_{bc10}$ and $C_{bc13}$, each of which would reduce the amplitude of such leakage current. Furthermore, when the voltage applied to the switching signal input terminal 22 is at the OPEN level, the only transistor in the circuit 7 that is conductive is the transistor 11. Thus, heat dissipated by the circuit in the OPEN condition is very small, which is a desirable factor if the circuit is to be included in an integrated circuit.

FIG. 6 shows another embodiment of the present invention with certain advantages over the circuit shown in FIG. 5. Most of the components in FIG. 6 are the same as those in FIG. 5 and serve similar purposes. The additional components include an additional semiconductor amplifier device in the form of an NPN transistor $Q_{14}$ having its emitter-collector circuit connected in series with the emitter-collector output circuit of the transistor $Q_{10}$ and the load resistor $R_9$. The base of the transistor $Q_{14}$ is connected by way of the resistor $R_{12}$ to the junction of the resistor 10 and the base of the transistor $Q_{12}$. A unidirectionally conductive circuit in the form of a pair of diodes $D_1$ and $D_2$ is connected between the base of the transistor $Q_{14}$ and the ground terminal of the power supply. The junction between the collector of the transistor $Q_{14}$ and the load resistor $R_9$ is connected directly to the base of a further semiconductor amplifier device in the form of another NPN transistor $Q_{15}$. This transistor is connected as an emitter follower having a resistor $R_{13}$ between the emitter of the transistor $Q_{15}$ and the ground terminal. The base of the amplifier transistor $Q_{13}$ is connected directly to the emitter of the emitter follower transistor $Q_{15}$.

In the operation of the circuit in FIG. 6, the transistor $Q_{14}$ further amplifies the information signal applied to the input terminal 21. The transistor $Q_{14}$ is connected in cascode with respect to the transistor $Q_{10}$. The transistor $Q_{15}$ merely changes the impedance and voltage level of the signal as applied to the amplifier transistor $Q_{13}$.

The purpose of the resistor $R_{12}$ and the diodes $D_1$ and $D_2$ is to operate as a stabilized base biasing circuit for the transistors $Q_{12}$ and $Q_{14}$ when these transistors are conductive, that is, during the CLOSED condition of the circuit. The voltage drop across the two diodes $D_1$ and $D_2$ is of the correct magnitude to furnish the proper bias for the transistor $Q_{14}$, but a third diode could be added in series, or these diodes could be replaced by a resistor to achieve the correct voltage level.

When the voltage level applied to the switching signal input terminal 22 shifts from the CLOSED level to the OPEN level, the switching transistor $Q_{11}$ becomes conductive and reduces the voltage at the bases of the transistors $Q_{12}$ and $Q_{14}$ to the point where they can no longer conduct current. As in FIG. 5, this interdicts the passage of the information signal from the terminal 21 to the terminal 24 by making the transistor $Q_{10}$ non-conductive. In addition to making the transistors $Q_{10}$ and $Q_{14}$ non-conductive, the base bias voltage of the transistor $Q_{15}$ is also reduced to the point where that transistor is nonconductive. This, in turn, reduces the voltage across the resistor $R_{13}$ and makes the transistor $Q_{13}$ non-conductive. By virtue of the non-conductivity of all four of the transistors through which the information signal has to pass going from the input terminal 21 to the output terminal 24, it is clear that virtually no signal leakage current can reach the terminal 24. In addition, since the only transistor in the circuit that remains conductive when the circuit is in its OPEN condition is the transistor $Q_{11}$, there is very little heat dissipation in the OPEN condition, and the circuit is very well adapted to be incorporated in an integrated circuit.

A typical set of parameters for the circuit in FIG. 6 is as follows:

| | |
|---|---|
| $R_9$ | 1.5K |
| $R_{10}$ | 6.2K |
| $R_{11}$ | 100 ohms |
| $R_{12}$ | 3.9K |
| $R_{13}$ | 1.5K |
| $C_1$ | 150pF |
| $C_2$ | 39pF |
| $V_{cc}$ | 12 volts |

Figures 7, 8:
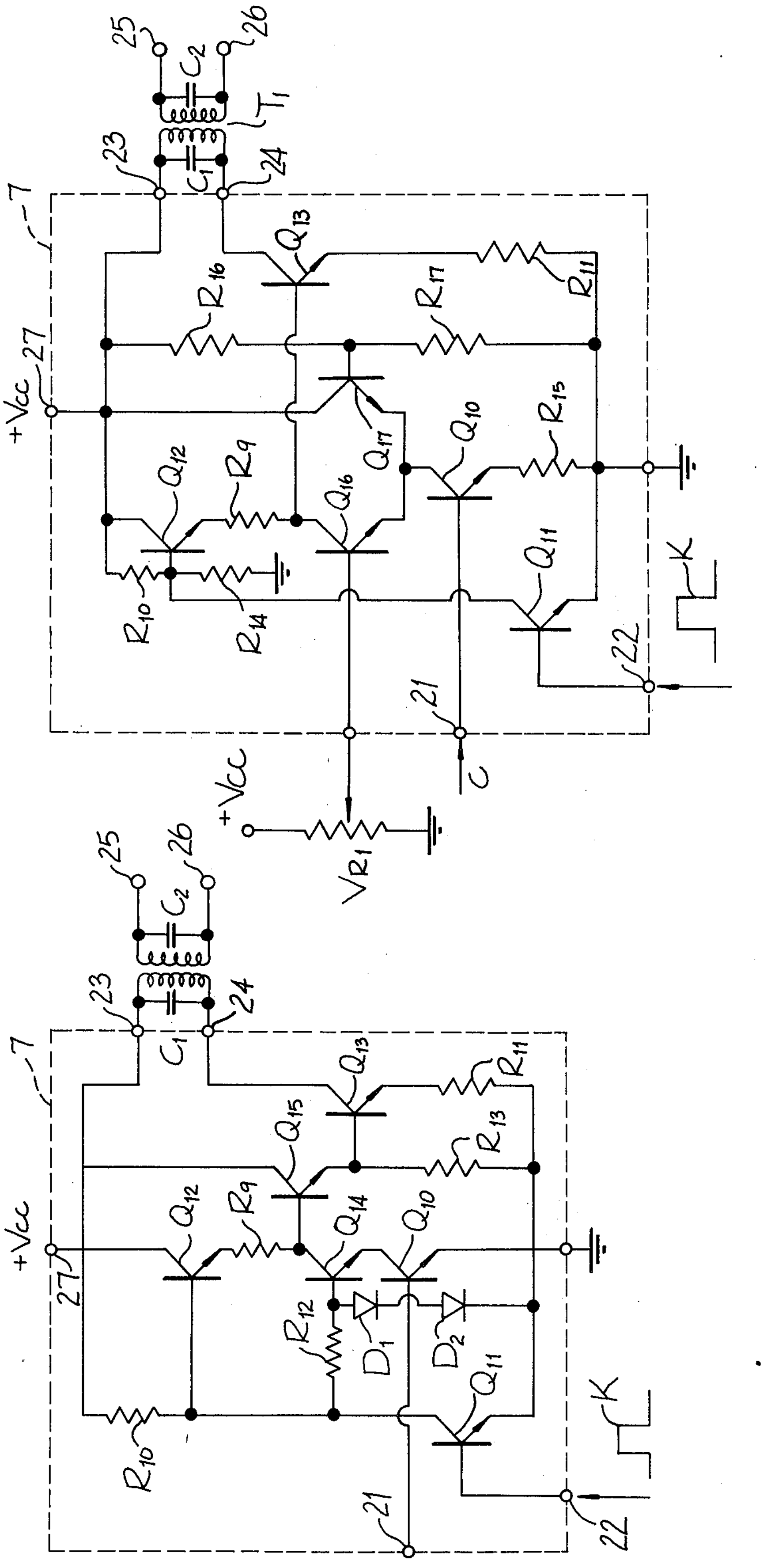

FIG. 7 shows another embodiment of the present invention. This circuit also has a number of components that are the same as those in FIG. 5, and only the new components will be described. Two additional semiconductor amplifier devices, here shown as NPN transistors $Q_{16}$ and $Q_{17}$, are differentially connected to the collector of the amplifier transistor $Q_{10}$. In this instance, the transistor $Q_{16}$ is much like the cascode transistor $Q_{14}$ in FIG. 6, and its emitter-collector circuit is connected between, and in series with, the emitter-collector circuit of the transistor $Q_{10}$ and the collector load resistor $R_9$. The base of the transistor $Q_{16}$ is connected to the arm of a potentiometer $VR_1$, and this potentiometer is connected across the power supply terminals so that the power supply voltage $V_{cc}$ is impressed across it. A resistor $R_{14}$ is connected in series with the resistor $R_{10}$ to act as a voltage divider to determine the bias voltage to be applied to the base of the switching transistor $Q_{12}$. Another voltage divider comprising resistors $R_{16}$ and $R_{17}$ is connected across the power supply terminals between the terminal 27 and ground, and the mid-point of this voltage divider is connected to the base of the transistor $Q_{17}$ so that, when the transistor $Q_{16}$ is non-conductive, the transistor $Q_{17}$ will be conductive. The emitter-collector output circuit of the transistor $Q_{17}$ is connected directly between the collector of the transistor $Q_{10}$ and the power supply terminal 27.

In the operation of the circuit in FIG. 7, when the voltage applied to the input terminal 22 is at the CLOSED level, the switching transistor $Q_{11}$ is non-conductive and the switching transistor $Q_{12}$ is conductive. The conductivity of the transistor $Q_{16}$ depends on the setting of the potentiometer $VR_1$ so that this potentiometer acts as a gain control for the circuit. This gain control operation serves as a color saturation control when the circuit 7 in FIG. 7 is used in a color television receiver. The transistor $Q_{17}$ is also conductive and acts as a gain control circuit together with the transistor $Q_{16}$ during the CLOSED condition of the circuit.

When the switching signal K applied to the switching signal input terminal 22 changes from the CLOSED level to the OPEN level, the switching transistor 11 short circuits the resistor $R_{14}$ and drops the voltage at the base of the transistor $Q_{12}$ to the point where that transistor can no longer conduct. As a result, current cannot flow through the transistor $Q_{16}$ but, by virtue of the differential operation, current can flow through the emitter-collector circuit of the transistor $Q_{17}$. Since the base of the transistor $Q_{13}$ is connected to the junction between the collector of the transistor $Q_{16}$ and the load resistor $R_9$, the transistor $Q_{13}$ also becomes non-conductive at this time.

Information signal C applied to the information signal input terminal 21 during the OPEN condition of the circuit can pass through the transistor $Q_{10}$, but the gain of the transistor as measured at its collector will be substantially zero since its collector is virtually short circuited to the power supply terminal 27 or the ground with reference to alternating current by the conductive transistor $Q_{17}$. This minimizes the amplitude of any information signal at the collector of the transistor $Q_{10}$. The transistor $Q_{16}$ is non-conductive, and so relatively little of the signal current could find a leakage path through the transistor $Q_{16}$. Any such leakage current would still have to find another leakage path past the non-conductive transistor $Q_{13}$ in order to reach the output terminal 24. Thus, this circuit, like that in FIG. 6 provides excellent separation of the input signal terminal 21 from the output signal terminal 24.

Because both the transistor $Q_{10}$ and $Q_{17}$ are conductive during the OPEN condition of the circuit, there is little more heat dissipation during the OPEN condition than is the case for the circuit in FIG. 6. However, the advantage of a gain control makes this circuit in FIG. 7 preferable to that in FIG. 6 for certain purposes.

A typical set of parameter values for the circuit in FIG. 7 is as follows:

| | |
|---|---|
| $R_9$ | 3K |
| $R_{10}$ | 1.2K |
| $R_{11}$ | 3K |
| $R_{14}$ | 11K |
| $R_{15}$ | 620 ohms |
| $R_{16}$ | 8.2K |
| $R_{17}$ | 3.6K |
| $VR_1$ | 10K |
| $C_1$ | 150pF |
| $C_2$ | 39pF |
| $V_{cc}$ | 12 volts. |

What is claimed is:

1. A switching circuit for an informational signal comprising: information signal input terminal means; information signal output terminal means; a first semiconductor amplifier device having an input electrode connected to said information signal input terminal means and an output circuit controlled by the information signal applied to said input electrode; switching signal input terminal means to receive a switching signal capable of shifting between an OPEN level and a CLOSED level; a switching semiconductor device having an input electrode and an output circuit controlled thereby; an output load impedance connected in a series circuit between said output circuit of said first semiconductor amplifier device and said output circuit of said switching semiconductor device; first and second voltage supply terminals connected to the opposite ends of said series circuit; circuit means connecting said switching signal input terminal means with said input electrode of said switching semiconductor device including a second switching semiconductor device having an input electrode connected to said switching signal input terminal means and an output circuit controlled by said switching signal to form a low impedance path between said input electrode of the first-named switching semiconductor device and said second voltage supply terminal when said switching signal reaches said OPEN level so that said output circuit of said first-named switching semiconductor device is conductive when said switching signal is at said CLOSED level and non-conductive when said switching signal is at said OPEN level; a second semiconductor ammplifier device having an input electrode and an output circuit connected to said information signal output terminal means and being controlled by the voltage applied to the respective input electrode; and circuit means connecting said input electrode of said second semiconductor amplifier device to said series circuit between said output load impedance and said output circuit of said first semiconductor amplifier device so that said output circuit of the second semiconductor amplifier device is conductive only when said output circuit of said first-named switching semiconductor device is conductive.

2. The switching circuit of claim 1, in which a third semiconductor amplifier device is connected in cascode between said output circuit of said first semiconductor amplifier device and said input electrode of said second semiconductor amplifier device and additional circuit means connect said third semiconductor amplifier device to said switching signal input terminal means to cause said third semiconductor amplifier device to be non-conductive when said switching signal is at said OPEN level.

3. The switching circuit of claim 2, in which said third semiconductor amplifier device includes an input electrode and an output circuit interposed in said series circuit between said output load impedance and said output circuit of said first semiconductor amplifier device, and in which said additional circuit means includes an impedance coupling said input electrode of the third semiconductor amplifier device to said input electrode of said first-named switching semiconductor device and unidirectionally conductive means connected in series between said input electrode of said third semiconductor amplifier device and said second voltage supply terminal.

4. The switching circuit of claim 1, further comprising a third semiconductor amplifier device including an input electrode, and an output circuit connected in series between said output circuit of said first semiconductor amplifier device and said output load impedance;

controllable bias means connected to the input electrode of said third semiconductor amplifier device to control the gain of information signals therethrough; and a fourth semiconductor amplifier device biased to be normally conductive and including an output circuit connected in series between said output circuit of said first semiconductor amplifier device and said first voltage supply terminal; and in which said third and fourth semiconductor amplifier devices comprise a differential amplifier.

5. A switching circuit for an informational signal comprising: information signal input terminal means; information signal output terminal means; a first amplifying transistor having a base electrode connected to said information signal input terminal means and a collector-emitter path having its conductivity controlled by the information signal applied to said base electrode; switching signal input terminal means to receive a switching signal capable of shifting between an OPEN level and a CLOSED level; a switching transistor having a base electrode and a collector-emitter path controlled thereby; an output load resistor connected in a series circuit between said collector-emitter path of said first amplifying transistor and said collector-emitter path of said switching transistor; first and second voltage supply terminals connected to the opposite ends of said series circuit; circuit means connecting said switching signal input terminal means with said base electrode of said switching transistor so that said collector-emitter path of the latter is conductive when said switching signal is at said CLOSED level and non-conductive when said switching signal is at said OPEN level; a second amplifying transistor having a base electrode and collector-emitter path connected to said information signal output terminal means and being controlled by the voltage applied to the respective base electrode; and circuit means connecting said base electrode of said second amplifying transistor to the collector of said first amplifying transistor so that said collector-emitter path of said second amplifying transistor is conductive only when said collectoremitter path of said switching transistor is conductive.

6. A switching circuit according to claim 5; in which said first and second amplifying transistors and said switching transistor are all of the same conductivity type.

* * * * *